United States Patent [19]

Iyori et al.

[11] Patent Number: 5,077,244
[45] Date of Patent: Dec. 31, 1991

[54] ALUMINUM NITRIDE SINTERED BODY AND SEMICONDUCTOR SUBSTRATE THEREOF

[75] Inventors: Yusuke Iyori, Fukaya; Hideko Fukushima, Kumagaya, both of Japan

[73] Assignee: Hitachi Metals, Ltd., Tokyo, Japan

[21] Appl. No.: 196,212

[22] PCT Filed: Aug. 13, 1987

[86] PCT No.: PCT/JP87/00607
§ 371 Date: Oct. 5, 1988
§ 102(e) Date: Oct. 5, 1988

[87] PCT Pub. No.: WO88/01259
PCT Pub. Date: Feb. 25, 1988

[30] Foreign Application Priority Data

Aug. 13, 1986 [JP] Japan .................. 61-189772
Sep. 20, 1986 [JP] Japan .................. 61-220838
Jul. 16, 1987 [JP] Japan .................. 62-177791

[51] Int. Cl.$^5$ .................. C04B 35/58; C01B 21/72
[52] U.S. Cl. .................. 501/96; 501/127; 501/153; 423/412
[58] Field of Search .................. 501/127, 153, 96; 423/412

[56] References Cited

U.S. PATENT DOCUMENTS

| 3,811,899 | 5/1974 | Stibbs et al. | 501/96 |
| 4,519,966 | 5/1985 | Aldinger et al. | 501/96 |
| 4,578,364 | 3/1986 | Huseby et al. | 501/96 |
| 4,618,592 | 10/1986 | Kuramoto et al. | 501/96 |

FOREIGN PATENT DOCUMENTS

| 0147101 | 7/1985 | European Pat. Off. |
| 0153737 | 9/1985 | European Pat. Off. |
| 0021764 | 1/1987 | Japan |

Primary Examiner—William R. Dixon, Jr.
Assistant Examiner—C. Melissa Bonner
Attorney, Agent, or Firm—Finnegan, Henderson, Farabow, Garrett & Dunner

[57] ABSTRACT

A highly heat-conductive aluminum nitride sintered body comprising 95.5 to 99.8% by weight of an aluminum nitride grain phase having an average grain size of 2 to 10 μm and the rest being substantially a dysprosium oxide phase and having a density of at least 99% of the theoretical density, at least 30% by weight of the oxide phase existing at the triple points of the aluminum nitride grains. By forming an alumina-based oxide layer on the sintered body and further forming on the oxide layer a plating layer of Ni and/or Cu via a vapor deposition layer, there can be obtained a semiconductor substrate having a high bonding strength to solder.

8 Claims, 4 Drawing Sheets 0.2 μm

ALUMINUM NITRIDE SINTERED BODY AND SEMICONDUCTOR SUBSTRATE THEREOF

TECHNICAL FIELD

The present invention relates to an aluminum nitride sintered body and a production process therefor and further to a semiconductor substrate using the sintered body and a production process therefor.

BACKGROUND

In recent years electronic equipment and apparatus have been improved so as to have a smaller size and a higher level of integration, and so there has arisen the very important task of removing the heat generated by various semiconductor devices including IC chips, mounted on electronic equipment and apparatuse. For the removal of the heat, various proposals have been made concerning part designing, circuit designing, materials and the like.

Currently, $Al_2O_3$ is in use as a material for most of the substrates for semiconductors such as high integration IC and the like. However, with the recent improvement of ICs to a higher integration and a higher operating speed and the resulting increase in the amount of heat released by IC chips, there has arisen a demand for a material of higher heat releasability. Hence, BeO, SiC, etc. have been investigated as a substrate material. While both BeO and SiC have a high heat conductivity of about 260 W/mk, BeO is disadvantageous in that it is expensive and its dust has toxicity, and SiC is not easy to produce because it is not sufficiently sintered under normal pressure and so it must be sintered by hot pressing.

Hence, attention has been paid to aluminum nitride as a material for semiconductor substrates, having a higher strength than $Al_2O_3$ and BeO, capable of being sintered at normal pressure and having a high heat conductivity. However, commercially available aluminum nitride powders usually contain about 2 to 3.5% by weight of oxygen and, from such a powder, it is difficult to produce an aluminum nitride sintered body of high heat conductivity, as described in Journal of the Ceramics Society of Japan, Vol. 93, No. 9, 1985, Pages 517-522 and in Electronic Ceramics, Vol. 16, No. 3, March 1985, pages 22-27. Hence, there was proposed a process comprising mixing appropriate proportions of alumina, ash and an alkaline earth metal, an yttrium alloy or the like in a liquid dispersing medium and then sintering the mixture in nitrogen or an ammonia atmosphere to obtain an aluminum nitride sintered body of increased purity and accordingly of improved sintering density and improved heat conductivity (Japanese Patent Laid-Open No. 60-65768).

There was also proposed an aluminum nitride sintered body obtained by adding to aluminum nitride for improving heat conductivity, boron nitride or an oxide of calcium, magnesium, aluminum, titanium, zirconium and/or a rare earth metal, preferably an yttrium oxide and then sintering the mixture (Japanese Patent Laid-Open No. 59-131583).

These aluminum nitride sintered bodies, however, have a large variation in heat conductivity between production lots and products of high heat conductivity cannot be obtained stably. These sintered bodies have a further problem that an aluminum nitride sintered body of high heat conductivity can be obtained only when the aluminum nitride used as a starting material contains a very low concentration of oxygen.

An aluminum sintered body can be used as a substrate for hybrid ICs whose patterning are not very fine, or as a package for high-integration logic circuit semiconductors. When the aluminum nitride sintered body is used as a substrate for hybrid ICs, even if a metallizing paste of a metal such as Mo, Mn or the like is directly printed on the surface of the sintered body and baked, the sintered body does not have a sufficiently high bonding strength to the metal. Therefore, it is desired that the bonding strength after baking be increased.

When the aluminum nitride sintered body is used as a substrate for semiconductor packages, ordinarily a silicon chip is mounted on the aluminum nitride substrate, and the upper surface of the silicon chip is covered by a ceramic such as aluminum nitride or the like with a lead frame connected to the silicon chip projecting outside through the interface between the aluminum nitride substrate and the ceramic cover. In order to increase the adhesion of the aluminum nitride substrate and the ceramic cover, the opposing surface portions of the aluminum nitride substrate and the ceramic cover which are in contact with each other are metallized and further the lead frame is soldered. However, aluminum nitride is difficult to metallize because it is chemically stable. Further, the aluminum nitride sintered body, having poor water resistance, tends to react with water to form ammonia, thereby being eroded.

In view of the above problems, it was attempted to laminate a metal such as silver, titanium, copper or the like on a substrate consisting of an aluminum nitride sintered body by means of vapor deposition to improve the wettability of the substrate. However, the metal layer thus formed by vapor deposition has a thickness of only about the order of Å and it is very difficult to form the metal layer in a thickness of the order of $\mu m$ in order to secure a sufficient bonding strength to solder or a soldering material enabling the mounting of the devices. This is because when the metal layer is formed up to a thickness of the order of $\mu m$, the internal stress becomes too large, making the metal layer highly likely to peel off.

Hence, an object of the present invention is to provide an aluminum nitride sintered body having a heat conductivity and a mechanical strength which are both sufficiently high for use in semiconductor substrates.

Another object of the present invention is to provide a process which can produce the above-mentioned aluminum nitride sintered body stably with substantially no variation in properties.

A further object of the present invention is to provide a highly heat-conductive semiconductor substrate obtained by subjecting the above-mentioned aluminum nitride sintered body to a surface treatment so that a paste of a metal such as Mo, Mn or the like can directly be printed on the resulting sintered body and baked to form a circuit pattern strongly adhering to the sintered body.

A still further object of the present invention is to provide a highly heat-conductive semiconductor substrate for packaging, having a strongly adhered metal layer formed by metallizing and so having improved wettability by solder or a soldering material.

DISCLOSURE OF THE INVENTION

The highly heat-conductive aluminum nitride sintered body according to the present invention comprises 95.5 to 99.8% by weight of an aluminum nitride grain phase having an average grain size of 2 to 10 μm and the rest being substantially a dysprosium oxide phase, and has a density of at least 99% of the theoretical density, wherein at least 30% by weight of the oxide phase exists at the triple points of the aluminum nitride grains.

Further, the process for producing a highly heat-conductive aluminum nitride sintered body according to the present invention comprises forming a dispersion of AlN particles containing a dysprosium alkoxide, hydrolyzing the dysprosium alkoxide to form a composite precipitate consisting of AlN particles and the hydrolysis product of the alkoxide adhering to the outer surfaces of the AlN particles, calcinating the composite precipitate to form a composite powder consisting of AlN particles and a fine powder of dysprosium oxide adhering to the outer surfaces of the AlN particles, and subjecting the composite powder to molding and then to sintering.

Further, the semiconductor substrate according to the present invention comprises a highly heat-conductive aluminum nitride sintered body comprising 95.5 to 99.8% by weight of an aluminum nitride grain phase having an average grain size of 2 to 10 μm and the rest being substantially a dysprosium oxide phase (at least 30% by weight of the oxide phase existing at the triple points of the aluminum nitride grains) and having a density of at least 99% of the theoretical density, and an alumina-based oxide layer having a thickness of 0.1 to 20 μm, formed at the surface of the aluminum nitride sintered body.

Further, the process for producing a semiconductor substrate according to the present invention comprises heating a highly heat-conductive aluminum nitride sintered body comprising 95.5 to 99.8% by weight of an aluminum nitride grain phase having an average grain size of 2 to 10 μm and the rest being substantially a dysprosium oxide phase (at least 30% by weight of the oxide phase existing at the triple points of the aluminum nitride grains) and having a density of at least 99% of the theoretical density, at 950° to 1,200° C. for not longer than 30 minutes in an atmosphere having an oxygen partial pressure of 21% or below to form an alumina-based oxide layer at the surface of the sintered body.

Further, the semiconductor substrate according to the present invention is a laminate comprising a highly heat-conductive aluminum nitride sintered body comprising 95.5 to 99.8% by weight of an aluminum nitride grain phase having an average grain size of 2 to 10 μm and the rest being substantially a dysprosium oxide phase (at least 30% by weight of the oxide phase existing at the triple points of the aluminum nitride grains) and having a density of at least 99% of the theoretical density, a thin film layer of Ni and/or Cu having a thickness of 100 to 8,000 Å, formed on the surface of the sintered body, and a layer composed of Ni and/or Cu and having a thickness of 0.1 to 10 μm, formed on the surface of the thin film layer.

Further, the process for producing a semiconductor substrate according to the present invention comprises heat-treating a highly heat-conductive aluminum nitride sintered body comprising 95.5 to 99.8% by weight of an aluminum nitride grain phase having an average grain size of 2 to 10 μm and the rest being substantially a dysprosium oxide phase (at least 30% by weight of the oxide phase existing at the triple points of the aluminum nitride grains) and having a density of at least 99% of the theoretical density, at 950° to 1,200° C. for not longer than 30 minutes in an atmosphere having an oxygen partial pressure of 21% or below to form an alumina-based oxide layer as a first layer at the surface of the sintered body, forming on the first layer a thin film layer composed of at least one metal selected from the group consisting of Ti, Cr, Mo and W and a thin film layer of Ni and/or Cu as a second layer and a third layer, respectively, according to a physical vapor deposition method, and forming on the third layer a layer of Ni and/or Cu as a fourth layer according to a plating method.

BEST MODE FOR CARRYING OUT THE INVENTION

The highly heat-conductive aluminum nitride sintered body of the present invention comprises 95.5 to 99.8% by weight of an aluminum nitride grain phase having an average grain size of 2 to 10 μm and the rest being substantially a dysprosium oxide phase. When the aluminum nitride grains have an average grain size of smaller than 2 μm, the dysprosium oxide is not likely to gather at the triple points of the aluminum nitride grains. When the aluminum nitride grains have an average grain size of larger than 10 μm, the sintered body has reduced mechanical strengths. The average grain size is preferably 3 to 7 μm.

The proportion of the aluminum nitride grain phase in the sintered body is 95.5 to 99.8% by weight and the rest is substantially a dysprosium oxide phase. When the proportion of the oxide phase is less than 0.2% by weight, the sintered body is not sufficiently sintered. When the proportion is more than 4.5% by weight, the oxide phase is not likely to gather at the triple points of the aluminum nitride grains. The proportion of the aluminum nitride grain phase is preferably 96.5 to 98.5% by weight.

The dysprosium oxide phase ordinarily contains Al in addition to Dy and is a glassy phase represented by a composition of $DyAlO_3$ and/or $Dy_3Al_2(AlO_4)_4$. The proportion of Dy in the oxide phase is about 60 to 80% by weight, the proportion of Al is about 5 to 50% by weight, and the proportion of O is about 10 to 40% by weight.

At least 30% by weight of the oxide phase gathers at the triple points of the aluminum nitride grains and the rest is scattered at the boundaries of the aluminum nitride grains. Since in general the heat conductivity of an aluminum nitride sintered body is reduced by the precipitation of an oxide phase on the boundaries of the aluminum nitride grains, the heat conductivity of the sintered body can be increased by gathering the oxide phase at the triple points of the aluminum nitride grains. However, the oxide phase inevitably exists at the grain boundaries to some extent and this is necessary to increase the mechanical strengths (e.g. bending strength) of the sintered body. Hence, the proportion of the oxide phase gathering at the triple points of the aluminum nitride grains is preferred to be 50 to 95% by weight.

The aluminum nitride sintered body having such a composition and structure has a density of at least 99% of the theoretical density. When the density is smaller than 99%, the sintered body has no sufficient heat conductivity and has poor mechanical strengths even if the sintered body satisfies the compositional and structural requirements mentioned above. The density is preferably at least 99.4%, particularly at least 99.9% of the theoretical density.

The aluminum nitride sintered body of the present invention further has a heat conductivity of at least 150 W/mk and a bending strength of at least 30 kg/mm$^2$ both at room temperature.

The highly heat-conductive aluminum nitride sintered body can be obtained by mixing an aluminum nitride powder and a dysprosium oxide powder, molding the mixture to form a green body and then sintering the green body. In order to stably produce an aluminum nitride sintered body of high heat conductivity and high sintering degree, it is preferable that the dysprosium oxide powder be allowed to adhere to the surfaces of the aluminum nitride particles uniformly and thinly to form a composite powder and then the powder be molded and sintered. The AlN particles have an average particle size of 1 μm or below and the dysprosium oxide powder adhering to the surfaces of the AlN particles has an average particle size of 0.2 μm or below. When the AlN particles has an average particle size of larger than 1 μm, the particles have poor sinterability. The average particle size of the AlN particles is preferably 0.3 to 0.8 μm. When the dysprosium oxide powder has an average particle size of larger than 0.2 μm, it is difficult to uniformly disperse the glassy phase of dysprosium oxide formed in the sintering step in the sintered body, and so the ceramic obtained has reduced toughness. The average particle size of the dysprosium oxide powder is preferably 0.005 to 0.08 μm.

The above composite powder can be produced by preparing a dispersion of an AlN powder containing a dysprosium alkoxide and hydrolyzing the dysprosium alkoxide. As the dysprosium alkoxide, there are preferably used those soluble in organic solvents, such as ethoxide, isopropoxide, butoxide and the like. In order to dissolve the dysprosium alkoxide, any organic solvent can be used. Particularly preferable organic solvents are polar solvents such as lower alcohols (e.g. ethanol, isopropanol, normal butanol), ketones (e.g. acetone, methyl ethyl ketone), and esters (e.g. ethyl acetate, butyl acetate).

The dispersion of an AlN powder is prepared by mixing a dysprosium alkoxide solution as mentioned above and a fine powder of AlN having a particle size of 1.0 μm or below and a BET specific surface of at least 5 m$^2$/g. This dispersion is mixed with a precipitating medium to hydrolyze the dysprosium alkoxide and thereby to obtain a dysprosium oxide ($Dy_2O_3$).

As the precipitating medium, there can be used water, ammonia water, an aqueous ammonium carbonate solution, an aqueous ammonium oxalate solution, etc. The use of a polar organic solvent as mentioned above for dissolution of the dysprosium alkoxide enables good dispersion of the AlN fine powder in the resulting solution and easy hydrolysis of the dysprosium alkoxide. The mixing of the AlN dispersion and the precipitating medium can be conducted by adding the precipitating medium to the AlN dispersion or by adding the AlN dispersion to the precipitating medium.

The dysprosium oxide formed by hydrolysis takes a form of fine particles and adheres to the surfaces of the AlN particles. The composite precipitate thus obtained is collected by filtration and then dried. An evaporation method can be used for drying, but a spray drying method is preferable for drying in a large amount.

The dried composite precipitate is calcinated at a temperature of 400° to 1,000° C. As the calcination time, 30 to 150 minutes is usually sufficient. The calcination can be conducted in the atmosphere but it is preferable to conduct the calcination in an non-oxidizing atmosphere in order to prevent the oxidation of the composite precipitate.

The composite powder obtained by calcination has a constitution in which the fine powder of $Dy_2O_3$ adheres to the surfaces of the AlN particles. It can be molded using an ordinary die or press. The molding pressure is ordinarily 0.2 to 2 kg/cm$^2$, and the molding time is 1 to 20 seconds. The green body obtained is preferably further pressed isotropically. By the isotropic pressing, the sintered body to be formed later can have an increased density and increased mechanical strengths.

The sintering of the green body can be conducted in $N_2$ gas at a temperature of 1,750° to 2,000° C. according to the normal pressure sintering method. Besides, there may be used special sintering methods such as a hot pressing method, a hot isostatic pressing (HIP) method and the like.

There can thus be obtained an aluminum nitride sintered body having the above mentioned properties.

The highly heat-conductive semiconductor substrate of the present invention comprises an aluminum nitride sintered body as mentioned above and an alumina-based oxide layer formed on the surface of the sintered body. The alumina-based oxide layer consists mainly of two phases, namely, an $\alpha$-$Al_2O_3$ phase and a phase of a solid solution of dysprosium and aluminum oxides. Since the solid solution of dysprosium and aluminum oxides in the alumina-based oxide layer serves as a binder for the $\alpha$-$Al_2O_3$ particles, the oxide layer can have sufficient water resistance. The oxide layer has a further feature of having good adhesion to a metallizing layer formed by baking a metal paste. Therefore, the semiconductor substrate of the present invention can preferably be used as a substrate for hybrid ICs. The alumina oxide layer has a thickness of 0.1 to 20 μm. When the thickness is smaller than 0.1 μm, the oxide layer is difficult to metallize and has insufficient adhesion to the metal layer formed by baking, causing peeling of the metal layer. When the thickness of the oxide layer is larger than 20 μm, the resulting semiconductor substrate has reduced heat conductivity, making difficult the release of the heat generated by semiconductor devices and reducing the adhesion of the oxide layer to the underlying AlN sintered body. The thickness of the oxide layer is preferably 0.2 to 3 μm.

With respect to a metal pattern layer formed on the above semiconductor substrate which is suitable for hybrid ICs, it is formed by printing a paste of a metal such as Mo, Mn, W or the like in a desired pattern according to screen printing and then baking the paste at 1,300° to 1,500° C. While the metal pattern layer formed directly on the AlN substrate has an adhesion strength of about 0.2 kg/mm$^2$, the strength is improved to 5 kg/mm$^2$ or more by providing the alumina-based oxide layer between the AlN substrate and the metal pattern layer.

The alumina-based oxide layer is produced according to the following method.

The alumina-based oxide layer is formed by heating the aluminum nitride sintered body in an atmosphere having an oxygen partial pressure of 21% or below, for example, air at a temperature of 950° to 1,200° C. for not longer than 30 minutes.

The reason for heating in an oxidizing atmosphere containing 21% or less of oxygen is that when the atmosphere used has a higher oxygen partial pressure than 21%, the resulting oxide layer has a lot of pores communicating with each other, making it impossible to form a dense layer of sufficient water resistance. The oxygen pressure of the atmosphere used is desirably 15% or below.

The reason for heating at 950° to 1,200° C. is that when a temperature lower than 950° C. is used, no α-Al$_2$O$_3$ layer is formed, and when a temperature higher than 1,200° C. is used, the resulting oxide layer has a lot of pores at the outer surface and the formation of a solid solution of dysprosium and aluminum oxides (this solid solution serves as a binder) is difficult. The heat treatment temperature is preferably 970° to 1,150° C. The reason for heating for not longer than 30 minutes is that when a time longer than 30 minutes is used, the lots of pores formed at the outer surface of the oxide layer communicate with each other and the oxide layer has a thickness larger than 20 μm making it impossible to fully utilize high heat conductivity inherently possessed by the aluminum nitride sintered body.

Another highly heat-conductive semiconductor substrate of the present invention comprises an aluminum nitride sintered body, a vapor deposition layer formed thereon and a thick film layer formed on the vapor deposition layer according to plating or other appropriate methods so that the semiconductor substrate can have a large adhesion strength to solder or a soldering material. As mentioned previously, aluminum nitride itself is chemically stable and accordingly has a very low adhesion strength to a plating layer to be formed thereon. The present inventor has found that the plating layer can have a remarkably increased adhesion strength by forming beneath the plating layer a thin film layer according to a physical vapor deposition method.

The plating layer consists mainly of Ni and/or Cu and can be formed according to an ordinary electroplating method. The underlying thin film layer is preferred to consist mainly of the same metal components as the plating layer and can be formed according to an ion plating method or a sputtering method. In order to increase the water resistance of the semiconductor substrate and the adhesion strength of the final laminate, it is preferable that an alumina-based oxide layer be formed first on the aluminum nitride sintered body. This oxide layer can be the same as the oxide layer previously mentioned. In order to further increase the adhesion strength between the alumina-based oxide layer and the thin film layer, it is preferable that a second thin film layer be formed between them. The second thin film layer preferably is composed of at least one metal selected from Ti, Cr, Mo and W all having good adhesion to the alumina-based oxide layer.

An example of the semiconductor substrate having all of the above-mentioned layers is explained below. This semiconductor substrate is a laminate comprising a first layer consisting of an alumina-based oxide, a second layer composed of at least one metal selected from the group consisting of Ti, Cr, Mo and W, formed on the first layer, a third layer consisting of a thin film layer of Ni and/or Cu, formed on the second layer and a fourth layer composed of Ni and/or Cu, formed on the third layer.

The first layer is the same alumina-based oxide layer as mentioned previously and has a thickness of 0.1 to 20 μm, preferably 0.2 to 3 μm.

The second layer has functions of increasing the adhesion strength between the first layer consisting of an alumina-based oxide and the third layer and further of preventing the solder or soldering material from penetrating into aluminum nitride. Therefore, the second layer is required to have a film thickness of at least 200 Å. However, when the film thickness is larger than 5,000 Å, the internal stress or strain generated during the formation of the metal film remains, causing the formation of voids and the peeling of the layer. Hence, the film thickness of the second layer is 100 to 8,000 Å, preferably 500 to 5,000 Å.

The third layer is required to have a film thickness of at least 100 Å in order to enable the uniform formation of the fourth layer. However, when the film thickness is larger than 8,000 Å, the internal stress or strain remains as in the case of the second layer, causing the formation of voids and peeling of the layer. Therefore, the film thickness of the third layer is 100 to 8,000 Å, preferably 500 to 5,000 Å.

The second layer and the third layer can each be formed according to a physical vapor deposition method such as an ion plating method, a sputtering method or the like.

The fourth layer is formed by plating of the same metal as used in the third layer and is required to have a thickness of 0.1 to 10 μm in order to secure a sufficient bonding strength to solder or a soldering material by forming an alloy therewith. When the thickness is smaller than 0.1 μm, no sufficient bonding strength is obtained and, when the thickness is larger than 10 μm, the same problem exists as in the third layer. The fourth layer preferably has a thickness of 1 to 5 μm. The fourth layer can be formed according to an electroplating method but can also be formed according to other methods such as an electroless plating method and the like.

It is preferable that the upper surface of the fourth layer is provided with a plating composed of Au, Ag, Pd or Pt and having a thickness of 0.05 to 5 μm, in order to have better wettability by solder or a soldering material and to protect the fourth layer from oxidation.

The semiconductor substrate thus formed has not only a large adhesion strength as a laminate but also high air tightness and high smoothness, and accordingly it is desirable for use as a substrate for packages of semiconductor devices such as large scale integrated circuits and very large-scale integrated circuits.

The present invention is described in more detail below by way of the following Examples.

EXAMPLE 1

Figure 1:
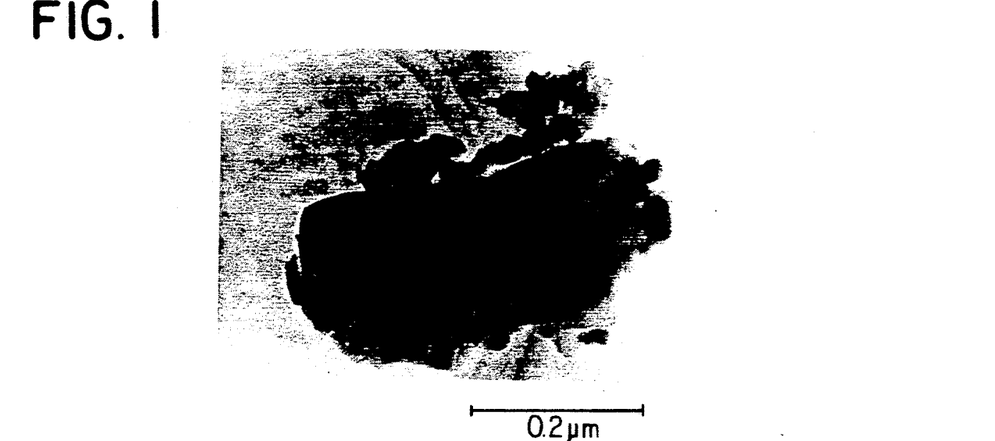
FIG. 1 is an electron micrograph showing the particle structure of a composite powder which is a raw material of the aluminum nitride sintered body of the present invention.

A commercially available aluminum nitride powder (oxygen content: 2.1% by weight) having an average particle size of 0.5 μm and a $Dy_2O_3$ powder having an average particle size of 0.2 μm were mixed at various mixing ratios shown in Table 1 and stirred for 24 hours in a plastic ball mill containing 500 cc of ethyl alcohol, using plastic balls. Each of the resulting mixtures was dried in vacuum and then sintered in $N_2$ gas of 1 atm under the conditions shown in Table 1. The properties of the sintered bodies obtained are shown in Table 1. The samples No. 13 and No. 14 were obtained using an AlN-$Dy_2O_3$ composite powder produced according to the alkoxide method described below. That is, to an ethanol solution of dysprosium butoxide was added an AlN powder having an average particle size of 1.0 μm or below and a BET specific surface area of 7 m$^2$/g, and they were made into a dispersion; this dispersion was slowly added to a water-ethanol solution to form a composite precipitate consisting of AlN particles and the hydrolysis product of a dysprosium butoxide covering the surfaces of the AlN particles; after the completion of hydrolysis reaction, the composite precipitate was dried in vacuum to obtain a dry powder of a composite precipitate; the dry powder was calcinated at 500° C. to obtain an AlN-$Dy_2O_3$ composite powder consisting of AlN particles and fine $Dy_2O_3$ particles having particle sizes of 100 to 200 Å and adhering to the surfaces of the AlN particles. A photograph by a transmission-type electron microscope (TEM), of the appearance of the composite powder is shown in FIG. 1.

In sample No. 16 which is a conventional sample for comparison with the samples of the present invention, a $Y_2O_3$ powder was used in place of the $Dy_2O_3$ powder; the same AlN powder as used above and this $Y_2O_3$ powder were mixed and vacuum-dried in the same manner as above; and the dry mixture was sintered in $N_2$ gas of 1 atm at 1,900° C. for 1 hour to obtain a sintered body of sample No. 16. Sample No. 15 which is also a conventional sample for comparison was obtained by using MgO as a sintering aid. The properties of the samples No. 15 and No. 16 are shown in Table 1.

Figure 2A:
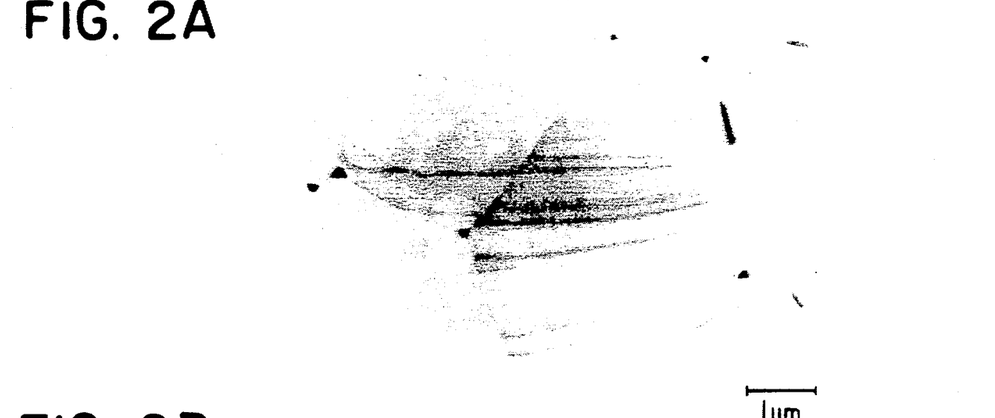
FIGS. 2A and 2B are scanning-type electron micrographs showing the fine structures of the aluminum nitride sitered bodies of samples No. 5 and No. 10, respectively.
Figure 2B:
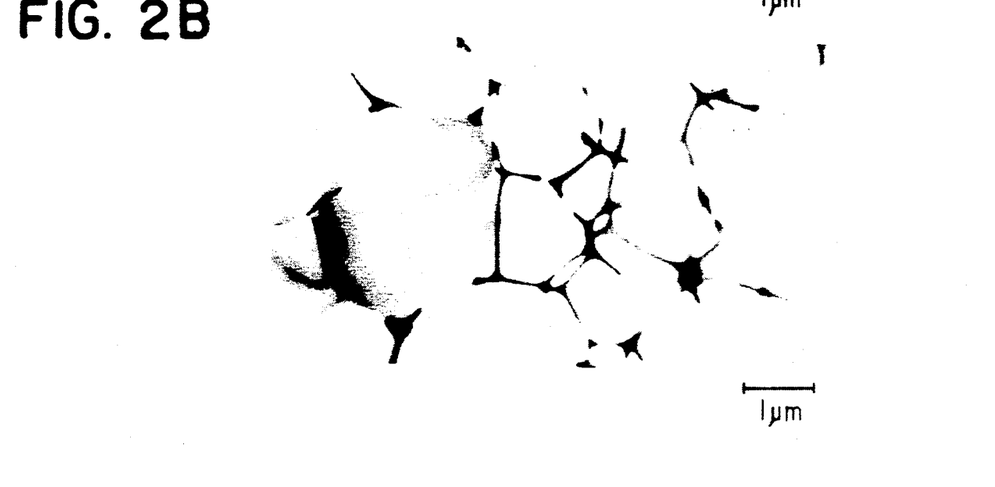

The photograph by scanning-type electron microscope (SEM) of samples No. 5 and No. 10 are shown in FIG. 2A and FIG. 2B, respectively. In the photographs of FIG. 2A and FIG. 2B, there is seen the existence of an Dy and Al-containing oxide phase ((Dy, Al)(O,N)) at the boundaries of the AlN grains. As is clear from Table 1, sample No. 5 in which the proportion of the Dy-Al oxide phase existing at the triple points of the AlN grains is higher has a higher heat conductivity of 186 W/mK. As is clear from Table 1, the proportion of the Dy-Al oxide phase existing at the triple points of the AlN grains differs depending on the amount of $Dy_2O_3$ added and the sintering temperature employed, but in general, the higher the proportion, the better the heat conductivity.

EXAMPLE 2

Using 2.5% by weight of a $Dy_2O_3$ powder having an average particle size of 0.1 μm as a sintering aid and 97.5% by weight of an AlN powder having an average particle size of 0.5 μm, an aluminum nitride sintered body was obtained under the sintering conditions of 1,850° C. and 1 hour. This sintered body was heated for 30 minutes in the atmosphere at each temperature of 900° C., 950° C., 1,000° C., 1,100° C., 1,200° C. and 1,300° C. to form an oxide layer at the surface of the sintered body. Each of the resulting oxide layers had the following average thickness.

| Heating temperature (°C.) | Average thickness (μm) |
|---|---|
| 900 | 0 |
| 950 | 0.1 |
| 1000 | 0.7 |
| 1100 | 2.1 |
| 1200 | 5.6 |
| 1300 | 8.4 |

The oxide layer formed by heating at 1,300° C., however, had a lot of pores. Therefore, it has poor water resistance and is not suitable for use in packages of semiconductor devices.

Figure 3:
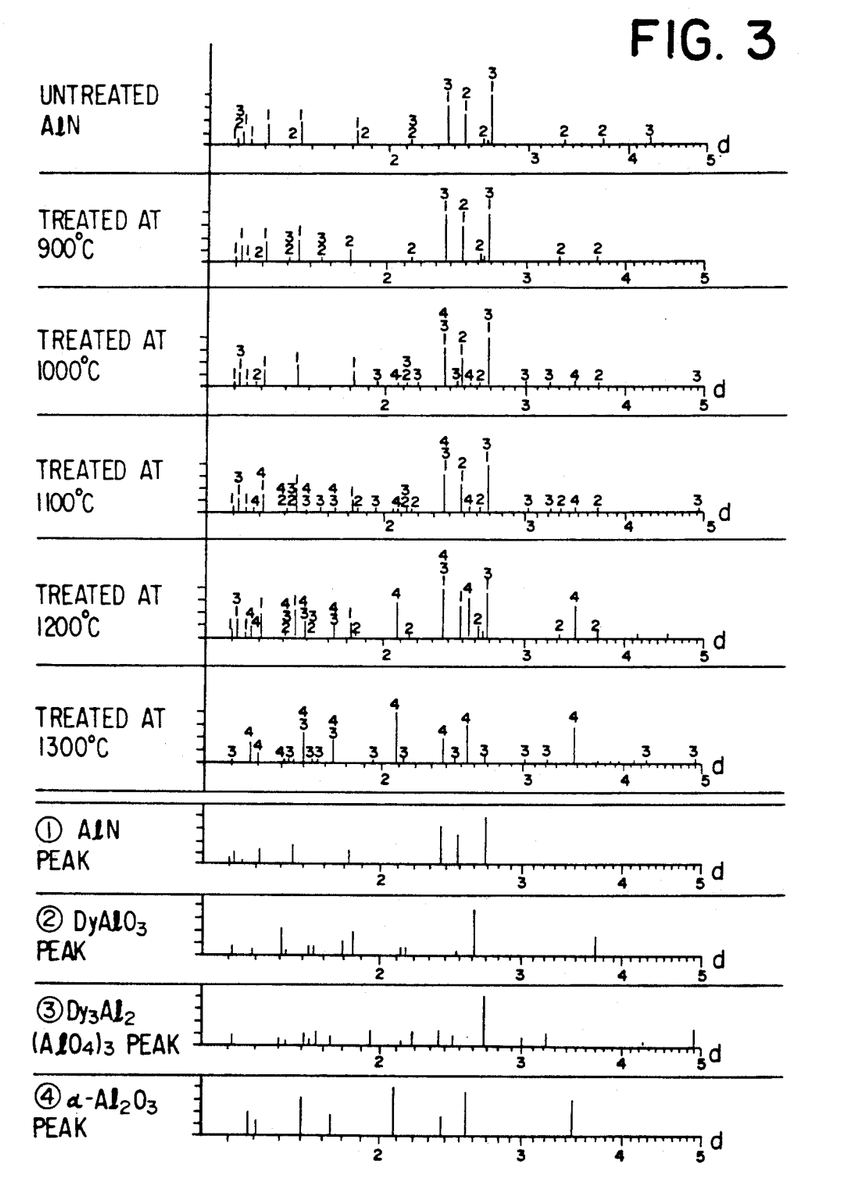
FIG. 3 is a graph showing the results of compositional analysis by X-ray diffractometry, of a sample of the present invention and a sample of Comparative Example.

The structures of oxide layers formed at the surface of the aluminum nitride sintered body at 900° C., 1,000° C., 1,100° C., 1,200° C. and 1,300° C. were measured according to the X-ray diffractometry. The results are

TABLE 1

| Sample No. | Mixing Ratio (wt. %) AlN | Mixing Ratio (wt. %) $Dy_2O_3$ | Sintering Temperature (°C.) | Sintering Time (hr) | Density Ratio (%) | Average Grain Size of AlN (μm) | Proportion of Oxide Phase at Triple Points (%) | Heat Conductivity (W/mK) | Bending Strength (Kg/mm$^2$) |
|---|---|---|---|---|---|---|---|---|---|
| 1 | 100 | 0 | 1900 | 1 | 82 | 2 | 0 | 50 | 10 |
| 2 | 99.9 | 0.1 | " | " | 93 | 4 | 40 | 62 | 15 |
| 3 | 99.7 | 0.3 | " | " | 99.9 | 4 | 90 | 203 | 30 |
| 4 | 99 | 1 | " | " | >99.9 | 5 | 95 | 195 | 40 |
| 5 | 97 | 3 | " | " | " | 6 | 90 | 186 | 50 |
| 6 | 95 | 5 | " | " | " | 7 | 50 | 150 | 50 |
| 7 | 93 | 7 | " | " | " | 8 | 25 | 82 | 50 |
| 8 | 97 | 3 | 1800 | " | " | 4 | 60 | 160 | 50 |
| 9 | 99 | 1 | " | " | >99.4 | 3 | 65 | 178 | 45 |
| 10 | 97 | 3 | 1750 | " | >99.9 | 2 | 30 | 150 | 50 |
| 11 | 97 | 3 | 1700 | " | 80 | 1.5 | — | 40 | 10 |
| 12 | 97 | 3 | 1900 | 8 | >99.9 | 11 | 95 | 185 | 20 |
| 13* | 97 | 3 | 1900 | 1 | >99.9 | 6 | 95 | 190 | 50 |
| 14* | 97 | 3 | 1800 | " | >99.7 | 3 | 70 | 168 | 50 |
| 15 | $Al_2O_3$-0.5 wt % MgO | | 1600 | " | >99.8 | 3 | — | 20 | 30 |
| 16 | AlN-3 wt % $Y_2O_3$ | | 1900 | " | 99.5 | 5 | 86 | 130 | 45 |

Note:
(1)*AlN powder and $Dy_2O_3$ powder were mixed by the alkoxide method.
(2) Sample Nos. 3-6, 8-10, 13 and 14 : Present Invention
Sample Nos. 1, 2, 7, 11, 12, 15 and 16 : Comparative Example shown in FIG. 3, in which ② DyAlO$_3$ and ③ Dy$_3$Al$_2$-(AlO$_4$)$_3$ are solid solutions of Dy and Al oxides.

As is clear from FIG. 3, when the heating temperature was 900° C., there was no formation of a layer consisting mainly of two phases, namely, an α-Al$_2$O$_3$ phase and a phase of a solid solution of Dy and Al oxides, but when the heating temperature was 1,000° to 1,300° C., there was formed an oxide layer consisting mainly of two phases, namely, an α-Al$_2$O$_3$ phase and a phase of a solid solution of Dy and Al oxides.

EXAMPLE 3

On the aluminum nitride sintered bodies each having an oxide layer obtained in Example 2 (heating temperatures: 1,000° C., 1,100° C., 1,200° C. and 1,300° C.), water resistance was examined in accordance with a pressure cooker test.

Figure 4:
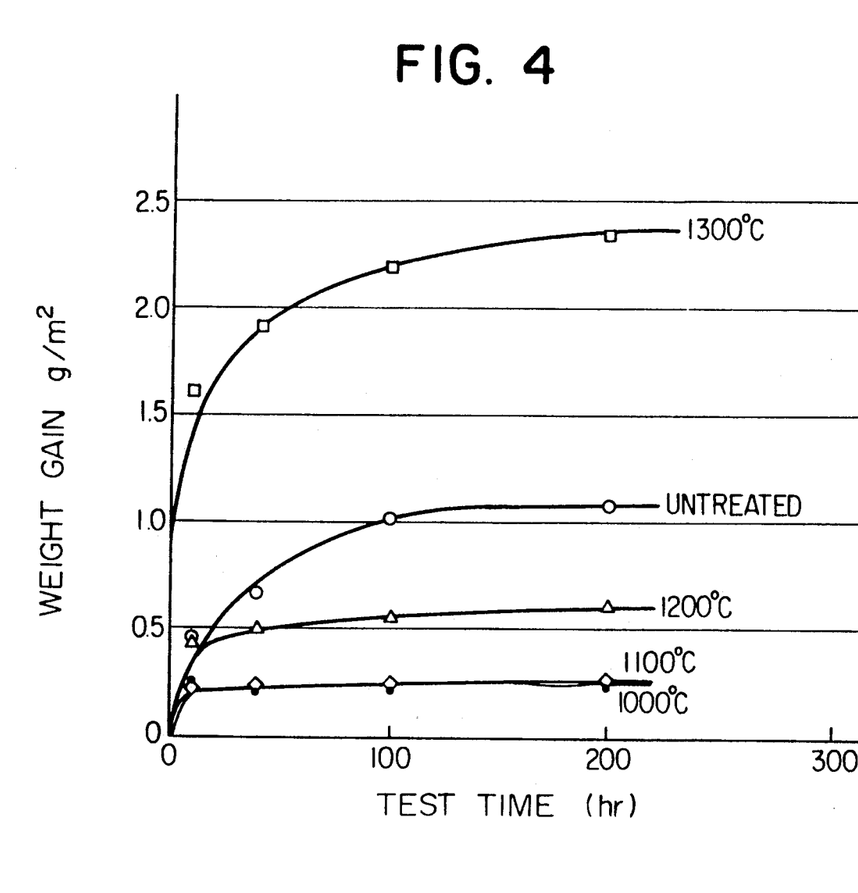
FIG. 4 is a graph showing the water resistances of a sample of the present invention and a sample of Comparative Example.

Each sintered body was subjected to the conditions of 121° C., 2 atm and a humidity of 100% to measure its weight increase due to corrosion. The relationship between the weight increase and the elapsed time is shown in FIG. 4. FIG. 4 includes, for comparison, the result of the untreated sample (the aluminum nitride sintered body having no oxide layer).

As is clear from FIG. 4, the samples whose heat treatment temperatures were 1,000° to 1,200° C. had a weight increase of about 0.7 g/m$^2$ or below, showing excellent water resistance. Meanwhile, the sample whose heat treatment temperature was 1,300° C. had a large weight increase, showing poor water resistance. This is presumed to be because the sample of 1,300° C. heat treatment had an oxide layer consisting mainly of α-Al$_2$O$_3$ and a solid solution of dysprosium and aluminum oxides but the layer was porous. Incidentally, the untreated sample had aluminum nitride exposed at the surface, and accordingly its water resistance was not good.

EXAMPLE 4

Figure 5:
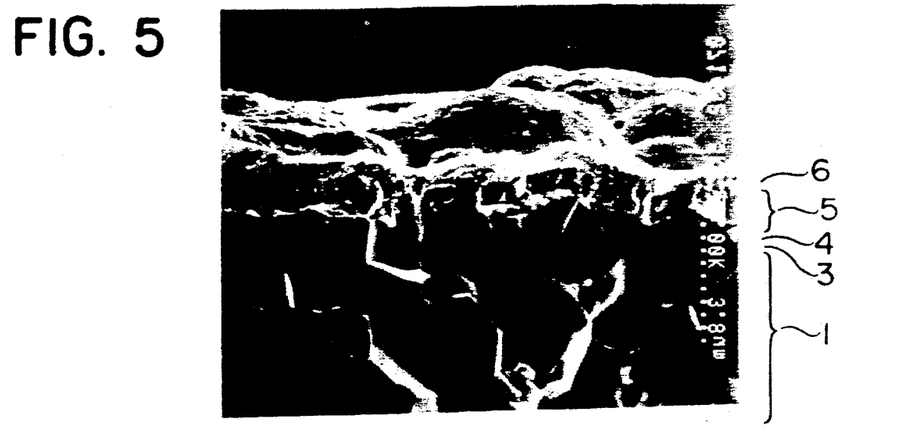
FIGS. 5 and 6 are electron micrographs showing the metal structures of metallized semiconductor substrates of the present invention.

On the surface of a sintered aluminum nitride plate (10 mm × 10 mm × 2 mm) produced under the same conditions as for the sample No. 4 of Example 1, were formed according to an ion plating method a titanium layer having a thickness of 2,000 Å (0.2 μm) and a nickel layer having a thickness of 5,000 Å (0.5 μm), in this order. Formed thereon was a nickel electroplating layer having a thickness of 4 μm and a gold electroplating layer having a thickness of 0.5 μm, in this order to obtain a semiconductor substrate. The section of the semiconductor substrate is shown in FIG. 5 (a scanning-type electron micrograph). In FIG. 5, 1 is an aluminum nitride sintered body layer; 3 is a thin Ti layer; 4 is a thin Ni layer; 5 is a Ni plating layer; and 6 is a gold plating layer.

EXAMPLE 5

Figure 6:
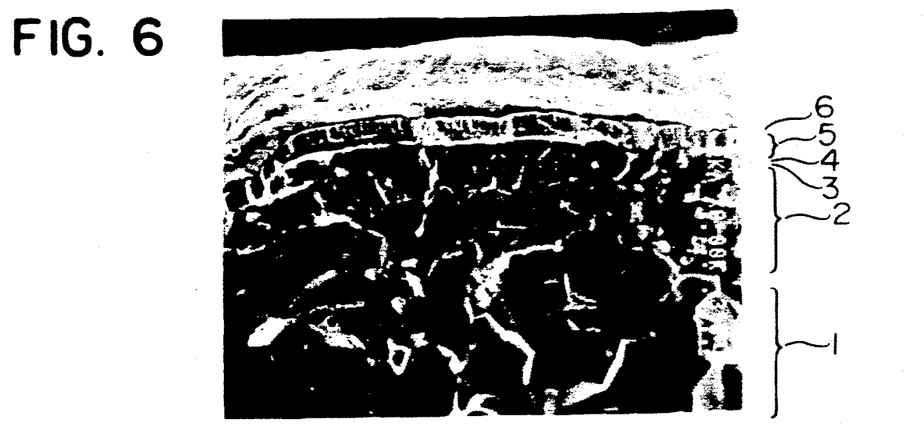

A sintered aluminum nitride plate (10 mm × 10 mm × 2 mm) produced under the same conditions as for the sample No. 5 of Example 1 was kept in the atmosphere at 1,100° C. for 30 minutes to form at the surface an alumina-based oxide layer (a first layer) having a thickness of 2 μm. On this first layer were formed, according to an ion plating method, a titanium layer (a second layer) having a thickness of 2,000 Å (0.2 μm) and a nickel layer (a third layer) having a thickness of 5,000 Å (0.5 μm), in this order. Further, there was formed a nickel electroplating layer (a fourth layer) having a thickness of 4 μm and a gold electroplating layer (a fifth layer) having a thickness of 0.5 μm to complete a semiconductor substrate. The scanning-type electron micrograph of the section of the substrate is shown in FIG. 6. In FIG. 6, 1 is an aluminum nitride sintered body; 2 is a first layer consisting of an aluminum-based oxide layer; 3 is a titanium ion plating film (a second layer); 4 is a nickel ion plating film (a third layer); 5 is a nickel electroplating layer (a fourth layer); and 6 is a gold plating layer (a fifth layer).

Figure 7:
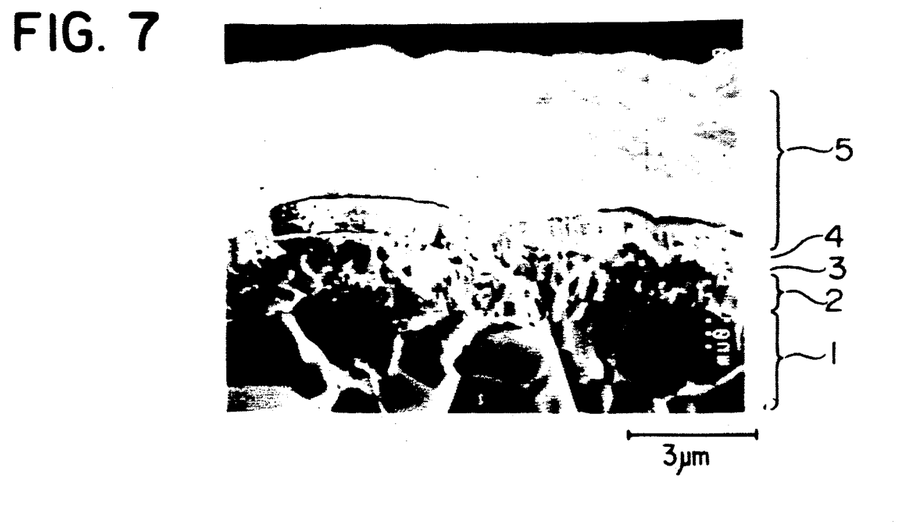
FIG. 7 is an electron micrograph showing the metal structure of a soldered semiconductor substrate of the present invention.

Molten solder was placed on the above semiconductor substrate to evaluate the substrate's wettability by solder and the corrosion of the aluminum nitride sintered body by solder. FIG. 7 is a photograph showing the metal structure when solder was placed on the semiconductor substrate. As is clear from FIG. 7, Ni in the fourth layer 5 formed an alloy with Sn and Pb constituting the solder. That is, the gold plating layer formed to secure wettability disappeared entirely and the nickel constituting the fourth layer 5 reacted with solder to form an alloy layer. Therefore, it is believed that a sufficient bonding strength is secured between the substrate and solder. The layers from the first layer 2 to the fourth layer 5 had strong adhesion between the adjacent layers and no peeling was observed. Tin and lead constituting the solder stayed within the fourth layer 5 and did not reach the aluminum nitride sintered body layer 1. Therefore, there was no corrosion of the aluminum nitride sintered body layer 1 by solder.

EXAMPLE 6

Film layers as shown in Table 2 were formed on the sintered aluminum nitride plate (the sample No. 6) of Example 1. The alumina-based oxide layer (expressed as Al$_2$O$_3$ in Table 2) was formed by heating the sintered body at 1,120° C. for 25 minutes in the atmosphere; the thin Ti layer and the thin Ni layer were formed according to a sputtering method; and the thick Ni layer was formed according to an electroplating method.

To the upper and lower surfaces of each of the thus formed semiconductor substrates were bonded aluminum pins via an epoxy resin to evaluate the bonding strength of each substrate. The results are shown in Table 2.

TABLE 2

| No. | Combination of Thin Layers | Bonding Strength (kg/mm$^2$) |
|---|---|---|
| 1 | AlN/Al$_2$O$_3$ | 10 or above |
| 2 | AlN/Al$_2$O$_3$/Ti | 7.5 |
| 3 | AlN/Al$_2$O$_3$/Ti/Ni | 7.4 |
| 4 | AlN/Al$_2$O$_3$/Ti/Ni/Au | 7.5 |
| 5 | AlN/Ti/Ni* | 5.1 |
| 6 | AlN/Ni* | 1.3 |

Note:
Layer thickness
Al$_2$O$_3$: 3 μm
Ti: 1,000 Å
Ni: 4,000 Å
Ni*: 3 μm

As is clear from Table 2, the semiconductor substrates having film layers in the combinations of the present invention had a bonding strength of at least 5 kg/mm$^2$. In particular, the substrates having an alumina-based oxide layer as a base layer and a thin Ti layer (and a thin Ni layer) as intermediate layer(s) had a high bonding strength of at least 7 kg/mm$^2$. In contrast, the substrate No. 6 obtained by forming a Ni plating layer directly on sintered aluminum nitride had a low bonding strength of 1.3 kg/mm$^2$.

EXAMPLE 7

The sintered aluminum nitride plate (the sample No. 13) of Example 1 was heated in the atmosphere at 1,000° C. for 25 minutes to form on the plate an alumina-based oxide layer having a thickness of 0.8 μm. On the oxide layer was printed a paste having a composition of Mo and Mn in a circuit pattern, and baking of the paste was conducted at 1,450° C. for 30 minutes. The adhesion strength of the metallizing layer thus formed was measured in accordance with a Sebastian method, and the result was 7.8 kg/mm$^2$. The adhesion strength was as low as 0.5 kg/mm$^2$ when the metallizing layer was formed directly on the above plate without forming the alumina-based oxide layer.

EXAMPLE 8

Semiconductor substrates were formed in the same manner as in Example 4 except that various thin film layers as shown in Table 3 were formed as the second layer in place of the Ti ion plating layer. The substrates were measured for bonding strength to solder and water resistance (shown by the weight increase observed when each substrate was left to stand for 200 hours under the conditions of 121° C., 2 atm and a humidity of 100%). The results are shown in Table 3.

TABLE 3

| | Second layer | | | Properties of Substrate | |
|---|---|---|---|---|---|
| No. | Composition | Thickness (μm) | Method of Formation | Bonding Strength (kg/mm$^2$) | Weight Increase (g/m$^2$) |
| 1 | Cr | 0.2 | Ion Plating | 7 or above | 1.5 |
| 2 | Mo | 0.2 | Ion Plating | 7 or above | 1.4 |
| 3 | W | 0.2 | Ion Plating | 7 or above | 1.4 |
| 4 | Ti | 0.3 | Sputtering | 7 or above | 1.7 |

As described above, an aluminum nitride sintered body of high heat conductivity and high strength can be produced stably according to the present invention. Further, the semiconductor substrate according to the present invention has good water resistance, good adhesion between the aluminum nitride sintered body and the metallizing layers formed thereon, and improved wettability by solder or a soldering material.

APPLICATIONS IN INDUSTRY

Since the aluminum nitride sintered body of the present invention has a high heat conductivity and high mechanical strengths, it is suitable for use as a semiconductor substrate. In particular, the substrate comprising such an aluminum nitride sintered body and an alumina-based oxide layer formed at the surface of the sintered body has a high adhesion strength to a metal layer formed thereon by applying a metal paste followed by baking, and so it is highly suitable as a substrate for hybrid ICs. On the other hand, the substrate comprising the aluminum nitride sintered body and a thick plating layer formed thereon via a vapor deposition layer has a high bonding strength to solder, is dense and highly air-tight, and has a smooth surface. Accordingly, it is suitable as a package for large scale integrated circuits and very large-scale integrated circuits.

We claim:

1. A highly heat-conductive aluminum nitride sintered body consisting essentially of 95.5 to 99.8% by weight of an aluminum nitride grain phase having an average grain size of 2 to 10 μm and the rest being substantially a dysprosium oxide phase and having a density of at least 99% of the theoretical density, at least 30% by weight of the oxide phase existing at the triple points of the aluminum nitride grains.

2. A highly heat-conductive aluminum nitride sintered body according to claim 1, which has a heat conductivity of at least 150 W/mK at room temperature and a bending strength of at least 30 kg/mm$^2$ at room temperature.

3. A highly heat-conductive aluminum nitride sintered body consisting essentially of 96.5 to 98.5% by weight of an aluminum nitride grain phase having an average grain size of 3 to 7 μm and the rest being substantially a dysprosium oxide phase, at least 50% by weight of the oxide phase existing at the triple points of the aluminum nitride grains, and having a density of at least 99.4% of the theoretical density, a heat conductivity of at least 150 W/mK at room temperature and a bending strength of at least 40 kg/mm$^2$ at room temperature.

4. A process for producing a highly heat-conductive aluminum nitride sintered body, which comprises forming a dispersion of AlN particles containing a dysprosium alkoxide, hydrolyzing the dysprosium alkoxide to form a composite precipitate consisting of AlN particles and the hydrolysis product of the alkoxide adhering to the surfaces of the AlN particles, calcinating the composite precipitate to form a composite powder consisting of AlN particles and a fine powder of dysprosium oxide adhering to the surfaces of the AlN particles, molding the composite powder, and sintering the molded powder, so as to form an aluminum nitride sintered body having a heat conductivity of at least 150 W/mK at room temperature.

5. The process according to claim 4, wherein the dispersion is formed by adding an AlN powder to an alcoholic solution of a dysprosium alkoxide.

6. The process according to claim 4 or 5, wherein the hydrolysis of the dysprosium alkoxide is conducted by adding the dispersion to a water-alcohol solution.

7. The process according to claim 4, wherein the calcination of the composite precipitate is conducted at a temperature of 400° to 1,000° C.

8. The process according to claim 4, wherein the AlN particles have an average particle size of 1.0 μm or below and the fine powder of dysprosium oxide has an average particle size of 0.2 μm or below.

* * * * *